United States Patent [19]

Murakami et al.

[11] Patent Number: 5,053,734
[45] Date of Patent: Oct. 1, 1991

[54] MAGNETOSTATIC WAVE DEVICE

[75] Inventors: Yasuhide Murakami; Shigeru Takeda, both of Kumagaya; Kohei Ito, Fukaya; Yasuaki Kinoshita, Hachioji; Sadami Kubota, Tottori, all of Japan

[73] Assignees: Hitachi Metals, Ltd.; Hitachi, Ltd.; Nippon Ferrite, Ltd., all of Tokyo, Japan

[21] Appl. No.: 497,518

[22] Filed: Mar. 22, 1990

[30] Foreign Application Priority Data

Mar. 24, 1989 [JP] Japan .................................. 1-073044

[51] Int. Cl.$^5$ .......................... H01P 7/00; H01P 1/218
[52] U.S. Cl. .................. 333/219.2; 333/204; 333/263
[58] Field of Search ............. 333/201, 202, 204, 205, 333/219, 219.2, 33, 246, 263; 331/107 SL

[56] References Cited

U.S. PATENT DOCUMENTS

| | | | |
|---|---|---|---|
| 3,681,716 | 8/1972 | Chiron et al. | 333/205 |
| 4,500,858 | 2/1985 | Mezak | 333/219.2 X |
| 4,626,800 | 12/1986 | Murakami et al. | 331/96 |
| 4,704,739 | 11/1987 | Murakami et al. | 333/204 X |
| 4,743,874 | 5/1988 | Kinoshita et al. | 333/219 |
| 4,751,480 | 6/1988 | Kunz et al. | 333/219.2 |

FOREIGN PATENT DOCUMENTS

| | | | |
|---|---|---|---|
| 0005701 | 1/1987 | Japan | 333/202 |
| 0030403 | 2/1987 | Japan | 333/204 |
| 62-245704 | 10/1987 | Japan . | |
| 63-228802 | 9/1988 | Japan . | |

OTHER PUBLICATIONS

Vendelin, G. D., "Design of Amplifiers and Oscillators by the S-Parameter Method", pp. 132-183, 1982.

*Primary Examiner*—Eugene R. LaRoche
*Assistant Examiner*—Seung Ham

[57] ABSTRACT

A magnetostatic wave device comprises a magnetic thin film formed on a non-magnetic substrate, one or a plurality of electrode fingers and pad electrodes formed on the above described magnetic thin film, a magnetostatic wave resonator for exciting and propagating a magnetostatic wave within said magnetic thin film and for causing resonance, and a matching stub connected to at least one of the above described pad electrodes of the above described magnetostatic wave resonator to adjust the impedance of the magnetostatic wave device.

13 Claims, 6 Drawing Sheets

MAGNETOSTATIC WAVE DEVICE

BACKGROUND OF THE INVENTION

The present invention relates to a magnetostatic wave device using magnetic spin resonance of a magnetic thin film formed on a non-magnetic substrate, and in particular to a thin film magnetostatic wave device having an optimum impedance with respect to a high-frequency circuit.

Magnetostatic wave devices have been proposed as devices used for high-frequency oscillation circuits, bandpass filters and the like. The above described magnetostatic wave device is produced by processing a YIG (yttrium iron garnet) thin film, which is formed on a GGG (gadolinium gallium garnet) non-magnetic substrate by the liquid phase epitaxial growth, so as to attain a required shape, for example. (Refer to JP-A-62-245704, for example.)

Figure 2:
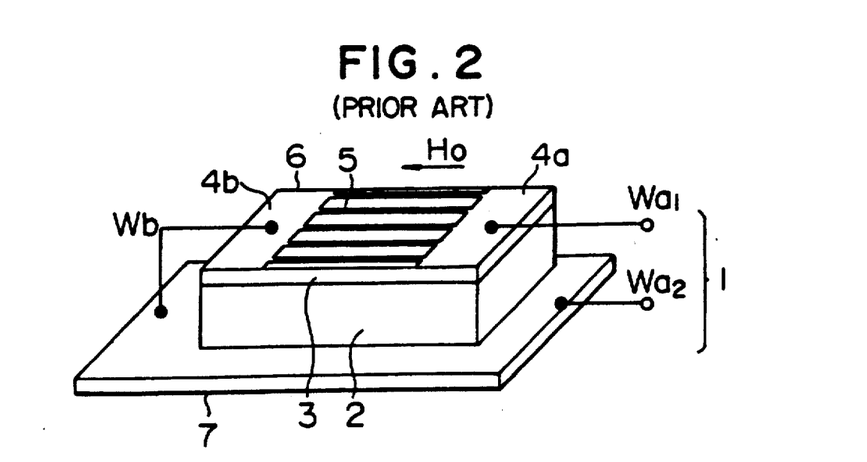
FIG. 2 is a diagram for illustrating a magnetostatic wave device of the prior art.

FIG. 2 is a diagram schematically illustrating the structure of a conventional magnetostatic wave device 1. With reference to FIG. 2, the magnetostatic wave device 1 comprises a magnetostatic wave resonator 6 and a lower conductor plate 7 so disposed as to come in contact with the lower face of a GGG substrate 2 of the magnetostatic wave resonator. The magnetostatic wave resonator 6 comprises a YIG thin film 3 formed on the GGG substrate 2 by using the liquid phase epitaxial method, a plurality of electrode fingers 5 each comprising a metal film, for example an Au film or an Al film formed on this YIG thin film by using the photolithography technique, and pad electrodes 4a and 4b respectively formed on both sides of these electrode fingers 5 by using the photolithography technique. The pad electrode 4b is connected to the lower conductor plate 7 by a wire Wb.

Figure 3:
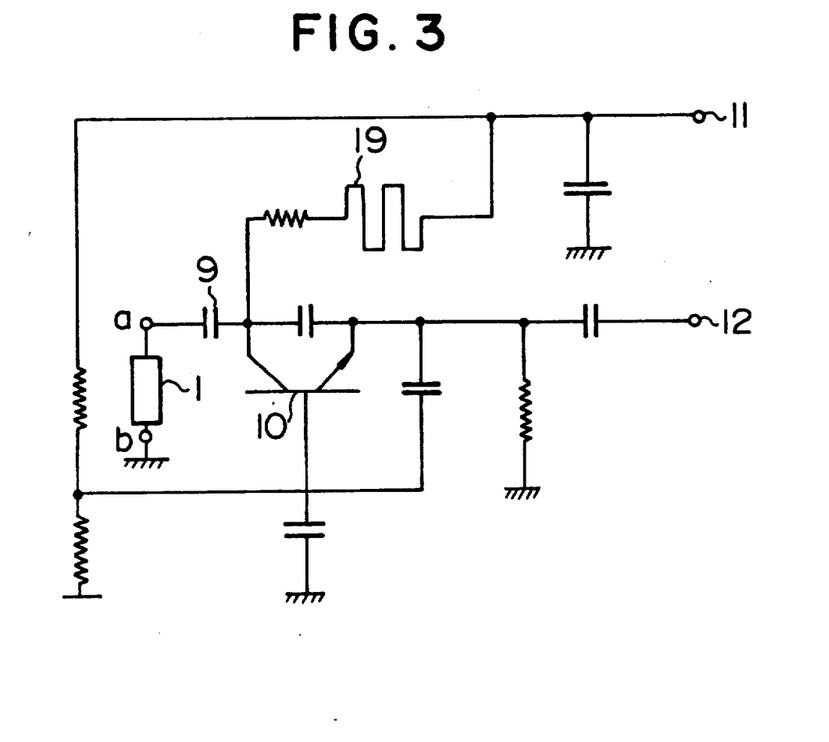
FIG. 3 is a diagram for illustrating an example of a high-frequency oscillation circuit using a magnetostatic wave device.

If a bias magnetic field Ho is applied to this magnetostatic wave device 1 in the lengthwise direction of the stripe electrode fingers 5 of the magnetostatic wave resonator 6 by a magnet which is not illustrated, the magnetostatic surface wave propagates on the face of the YIG film 3 and on the boundary face between the YIG thin film and the GGG substrate 2 in a direction, which is defined with respect to Ho by the right-handed screw rule. The magnetostatic surface wave is rotated in the clockwise direction from the surface to the boundary face at the right end portion and from the boundary face to the surface at the left end portion. Resonance is caused at such a frequency that the whole rotation length corresponds to integer times the wavelength. By connecting input and output wires Wa1 and Wa2 of the magnetostatic wave device respectively to terminals a and b of a negative resistance circuit as shown in FIG. 3, for example, therefore, a high-frequency oscillation circuit can be formed. (Refer to JP-A-63-228802.)

FIG. 3 shows a high-frequency oscillation circuit of Colpitts type comprising the magnetostatic wave device 1. Numeral 11 denotes a DC input, and numeral 12 denotes a high-frequency output.

Further, in this circuit, a capacitor 9 prevents the collector of a transistor 10 from being grounded, and an inductive reactance device 19 prevents the high-frequency current from flowing into a power supply circuit.

As for the high-frequency oscillation circuit, refer to "Design of Amplifiers and Oscillators by the S-Parameter Method", George D. Vendelin pp. 132 to 183.

It has been disclosed that such a high-frequency oscillation circuit comprising the magnetostatic wave device 1 has very high selectivity (Q) and the oscillation frequency can be changed in a wide range by changing the strength of the bias magnetic field Ho.

Further, it has also been disclosed that the above described magnetostatic wave device comprising the YIG thin film can be used from low temperature, say, $-30°$ C. because of its resonance mechanism, and a relatively inexpensive cost can be attained because the device is fabricated by the photolithography technique.

Further, a method whereby the capacitor 9 shown in FIG. 3 is omitted by separating the electrode fingers 5 each other is also disclosed in the aforementioned JP-A-63-228802.

In case the magnetostatic wave device 1 is used in the high-frequency circuit of negative resistance type as shown in FIG. 3, it is now assumed that the coupling point (a shown in FIG. 3) between the magnetostatic wave device and the negative resonance circuit is used as the measurement reference plane and the impedance of the magnetostatic wave device seen from this reference plane is $\Gamma_R$ (with an absolute value $|\Gamma_R|$ and a phase $\theta_R$) whereas the impedance of the negative resistance circuit seen from the reference plane is $S'_{11}$ (with an absolute value $|S'_{11}|$ and a phase $\theta_{11}$) When a measurement is taken with a small signal level, oscillation is started under the conditions represented by the following expressions.

$$|\Gamma_R| \; |S'_{11}| \geqq 1 \text{ and } \theta_R + \theta_{11} = 0$$

As the amplitude becomes large, the negative resistance becomes small because of nonlinearity of the transistor and other reasons. Then the relation $|\Gamma_R| \; |S'_{11}| = 1$ is satisfied and oscillation is stably continued.

In order to quickly find out the optimum condition of the frequency characteristics and the like, impedances of the magnetostatic wave device and the negative resistance circuit are measured while the circuit pattern is being subject to trimming. Possibility of oscillation can be known by comparing the reciprocal $1/S'_{11}$ of the impedance of the negative resistance circuit with the impedance $\Gamma_R$ of the magnetostatic wave device on the Smith chart as shown in FIG. 4.

Figure 4:
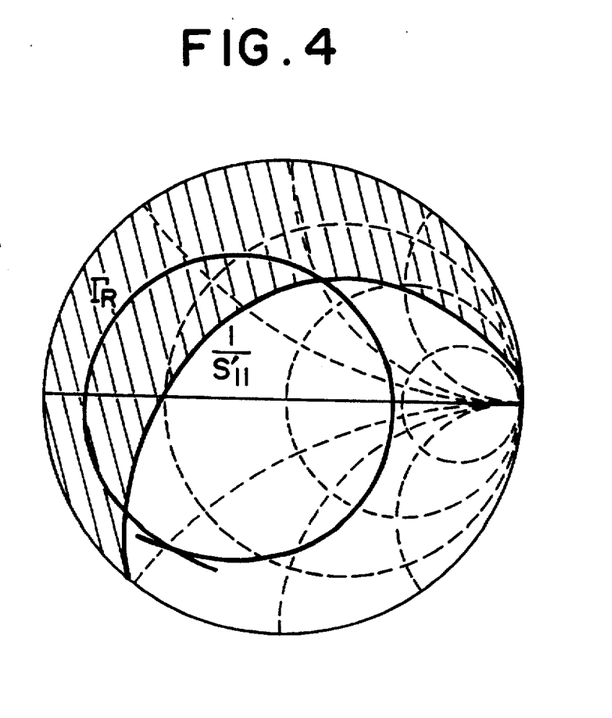
FIG. 4 is a Smith chart for generally illustrating the oscillation condition of a magnetostatic wave device.

In FIG. 4, a shaded region represents an oscillation possible region seen from the negative resistance circuit. In the impedance adjustment on the side of the magnetostatic wave device for optimization of frequency characteristic, the impedance of the magnetostatic wave device must be adjusted so that the impedance of the magnetostatic wave device is brought into the shaded region shown in FIG. 4.

In reality, in case the magnetostatic wave device 1 shown in FIG. 2 is used in the high-frequency oscillation circuit shown in FIG. 3, the lower conductor plate 7 is grounded. Because of this structure, therefore, possible adjustment of the impedance on the side of the magnetostatic wave device 1 can comprise only increasing and decreasing the number of wires and length of the wire Wb connecting the pad electrode 4b to the lower conductor plate 7 and the wire Wa1 connecting the negative resistance circuit to the pad electrode 4a.

On the side of the negative resistance circuit, therefore, it was necessary to make matching with respect to the impedance of the side of the magnetostatic wave device.

Since the impedance of the negative resistance circuit side changed delicately as a result of dispersion in various constants of semiconductor amplifying devices such as transistors, dispersion in the circuit pattern, and dispersion in constants of resistors and capacitors, it was difficult to cause oscillation in the optimum state.

In some cases, therefore, it was necessary to remake the magnetostatic wave device with changed electrode dimensions.

SUMMARY OF THE INVENTION

An object of the present invention is to provide such a magnetostatic wave device that impedance matching can be easily performed on the side of the magnetostatic wave device.

Another object of the present invention is to provide such a magnetostatic wave device that a required impedance value can be stably realized by making mechanically strong wiring connection.

In accordance with a feature of the present invention, a magnetostatic wave device having a magnetic thin film magnetostatic wave resonator comprising a magnetic thin film such as YIG formed on a non-magnetic substrate such as GGG, one or plural electrode fingers formed on the above described magnetic thin film, and pad electrodes formed on the above described magnetic thin film, whereby magnetostatic waves are excited within the above described magnetic thin film by microwaves and are propagated to cause resonance, further comprises a matching stub for adjusting the impedance of the magnetostatic wave device, the matching stub being connected to at least either of the above described pad electrodes.

By providing the pad electrodes of the magnetostatic wave resonator with the matching stub, impedance matching between the magnetostatic wave device side and the negative resistance circuit side can be easily made on the magnetostatic wave side. The matching stub functions to change the impedance of the magnetostatic wave device side by changes in its shape and location.

In case a conductor plate is used as the matching stub, for example, the impedance is changed to attain the impedance matching with respect to the negative resistance circuit side.

Further, in accordance with the present invention, a magnetostatic wave device comprises the above described magnetostatic wave resonator disposed on a disconnection section of a microstrip line formed by removing a part of a conductor face, one of resultant conductor sections used as a connection end to the negative resistance circuit, one of the above described pad electrodes connected to the connection end, the other of the resultant conductor sections used as a matching stub for adjusting the impedance of the magnetostatic wave device, and the other of the above described pad electrodes connected to the above described matching stub.

By thus forming a magnetostatic wave device on a microstrip line, the magnetostatic wave device withstands a shock which is stronger than that of the case where a coaxial line is used for connection, resulting in stable high-frequency oscillation.

Further, the matching stub may be disposed on the connection end for the negative resistance circuit. In this case, a new matching stub becomes unnecessary, resulting in a small size.

The microstrip line comprises a conductor plate formed on one face of a dielectric material and a grounded conductor plate formed on the other face of the dielectric material.

The above described matching stub is a conductor plate of a microstrip line. At the time of fabrication, the matching stub is so formed as to be a little longer. By gradually reducing the length, impedance matching may be performed.

Further, by disposing a lower conductor plate under the non-magnetic substrate, the phase of the impedance on the magnetostatic wave device side is rotated. Even a magnetostatic wave device having an oscillation frequency band located at the relatively low frequency side is thus able to match in impedance with the high-frequency circuit by adjusting the matching stub.

By forming a direct current path between this lower conductor plate and the grounded conductor plate of the microstrip line by means of through-holes or the like, the phase of the impedance on the magnetostatic wave device is rotated. Even a magnetostatic wave device having an oscillation frequency band located at the high frequency side is thus able to match in impedance with the high-frequency circuit by adjusting the matching stub.

In case the impedance of the magnetostatic wave device is changed by the above described through-hole and the lower conductor plate to cause oscillation, a negative resistance circuit having an impedance suited to it must be designed. Adjustment of the matching stub is fine adjustment for impedance matching.

As for joining, in the above described magnetostatic wave device, a pad electrode with a conductor plate functioning as the matching stub or the connection end to the negative resistance circuit, joining using the conductor connection plate is preferable to joining using wire bonding because an external shock causes a smaller impedance change resulting in higher strength.

Further, in case direct current connection between the pad electrode of the magnetostatic wave resonator and the grounded conductor plate of the microstrip line is no performed in the above described magnetostatic wave device, the above described capacitor 9 which is shown in FIG. 3 and which has been conventionally necessary.

Since the present invention facilitates impedance matching on the side of the magnetostatic wave device, the frequency of the high-frequency oscillation circuit can be easily adjusted.

DESCRIPTION OF THE PREFERRED EMBODIMENT

Figure 11:
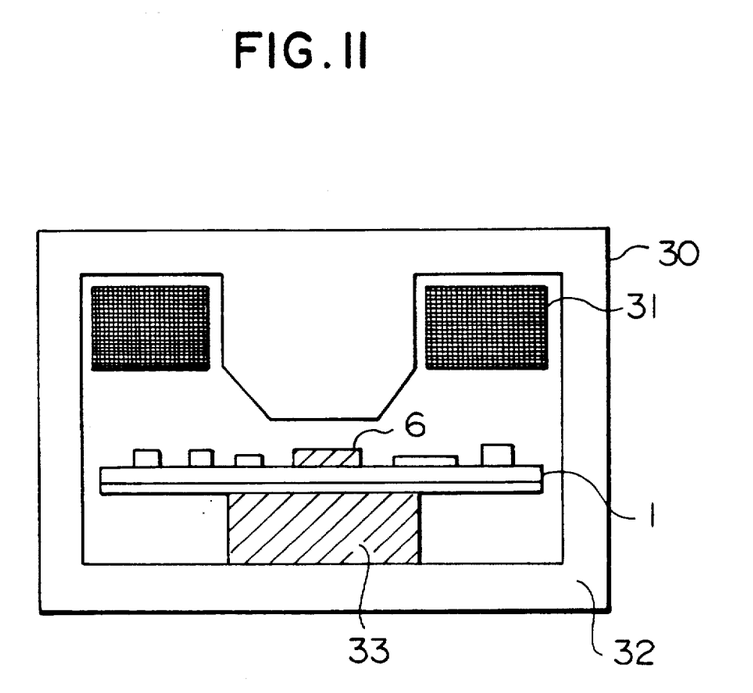
FIG. 11 is a diagram for illustrating the state in which a magnetostatic wave device is installed in a magnetic field applying apparatus.

A magnetostatic wave resonator device according to the present invention is installed in a magnetic field applying apparatus. FIG. 11 is a diagram for illustrating an example of a magnetostatic wave resonator device installed in a magnetic field applying apparatus 30. The magnetic field applying apparatus 30 comprises a drive coil 31, a yoke 32 and a permanent magnet 33, for example.

Figure 12:
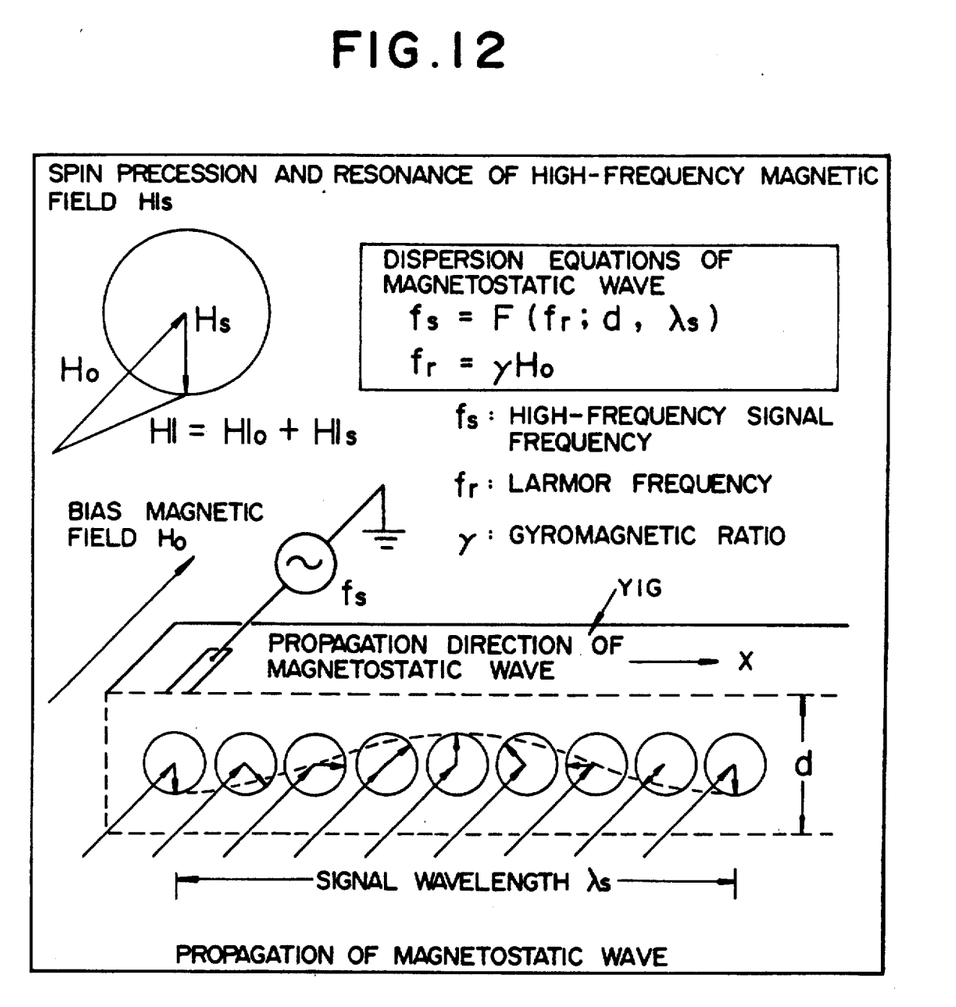
FIG. 12 is a diagram for generally illustrating the operation of a magnetostatic wave device.

Operation of a magnetostatic wave device performed when a magnetic field is applied thereto will now be described. FIG. 12 is a diagram for illustrating the propagation of a magnetostatic wave (MSW) in a magnetostatic wave resonator 6. If a bias magnetic field Ho having a constant strength and a high-frequency magnetic field Hs are additively applied to a magnetic material, electron spin of the magnetic material precesses. Denoting the magnetic field vector of the magnetic material by H1 and the magnetization vector by M1, the precession is represented by the Gilbert's equation of motion as $$\frac{dM1}{dt} = -|\gamma| (M1 \times H1) + \frac{\alpha}{M_S}\left(M1 \times \frac{dM1}{dt}\right) \quad (1)$$

where $\gamma$ is the gyromagnetic ratio, and $\alpha$ is the Gilbert's damping constant. The gyromagnetic ratio is represented as $$|\gamma| = |g|e/2mc$$

where e is the charge of an electron, m mass of an electron, c light velocity, and g g factor (nearly equivalent to 2)

In case the amplitude of the high-frequency magnetic field is not uniform in the magnetic material, phase difference is caused in adjacent spins by mutual energy exchange action, and spin resonance is propagated as a wave. Since the wavelength of the above described spin wave is $10^{-3}$ to $10^{-4}$ times as compared with that of the electromagnetic wave, the spin wave is propagated as a magnetostatic wave (MSW) in accordance with quasistatic approximation. The propagation mode of the magnetostatic wave differs depending upon the application direction of the bias magnetic field Ho and the shape of the thin film. If a bias magnetic field is applied in a direction perpendicular to the film face of the thin film, a forward volume wave is propagated. If a bias magnetic field is applied in a direction parallel to the film face of the thin film, a surface wave and a backward volume wave are propagated.

The magnetostatic wave device uses the above described property of the magnetostatic wave in a variable frequency resonator and functions as a high-frequency oscillator and a filter.

The present invention relates to the impedance matching method of the magnetostatic wave device performing the above described operation.

The present invention will hereafter be described in detail by referring to embodiments.

Embodiment 1

Figure 1A:
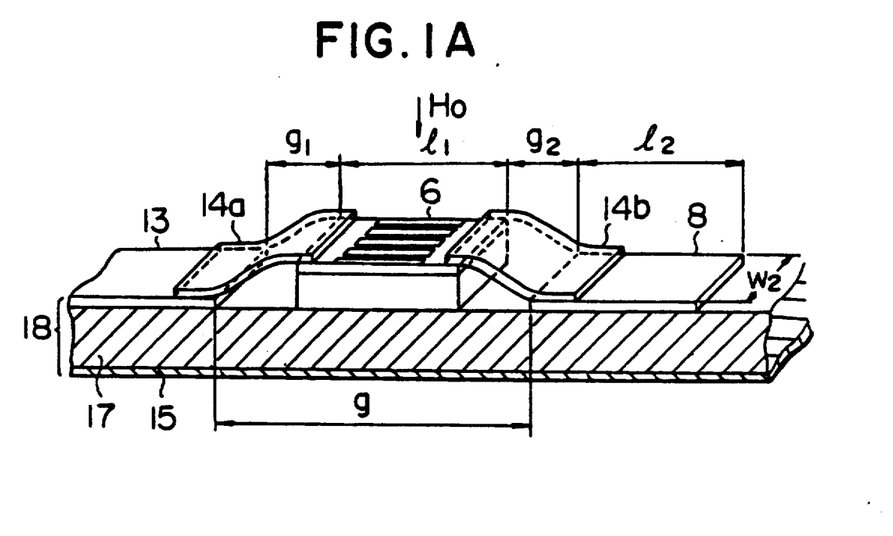
FIG. 1A is a diagram for illustrating an embodiment of a magnetostatic wave device according to the present invention.
Figure 1B:
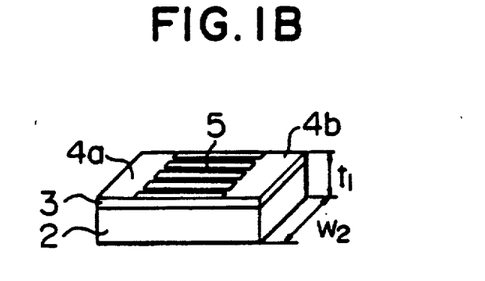
FIG. 1B is a diagram for illustrating a magnetostatic wave resonator device used in the embodiment of the present invention which is shown in FIG. 1A.

FIG. 1A is a diagram for illustrating an embodiment of the present invention. FIG. 1B is a diagram for illustrating a magnetostatic wave resonator used in FIG. 1A.

A magnetostatic wave resonator 6 comprises a GGG substrate 2 having length ($l_1$) of 5 mm, width ($w_1$) of 2 mm and thickness ($t_1$) of 0.5 mm, a YIG film 3 so formed on the GGG substrate 2 by using the liquid-phase epitaxial growth method as to have thickness of 40 $\mu$m, and five electrode fingers 5 having width of 30 $\mu$m and length of 3 mm and pad electrodes 4a and 4b fabricated by forming an Au film on the YIG film by means of the evaporation method and removing the Au film by means of the photolithography method. The dimensions and shape of the magnetostatic wave resonator 6 which have been used for explanation represent an example.

A microstrip line 18 comprising conductor plates formed on both faces of the dielectric substance 17 is etched to form a gap g which is larger than the length $l_1$ of the magnetostatic wave resonator 6. A copper conductor plate 13 functioning as the connection end to the negative resistance circuit and a matching stub 8 are thus fabricated.

The magnetostatic wave resonator 6 is fixed in the portion of the gap g by means of epoxy resin, for example. The pad electrode 4a and the conductor plate 13 are joined together by means of a copper connection plate 14a and solder. The pad electrode 4b is joined to the matching stub 8 having length ($l_2$) of 9 mm and width ($W_2$) of 2 mm by means of a copper connection plate 14b and solder. A magnetostatic wave device 1 shown in FIG. 1A is thus fabricated.

The dielectric substance 17 is made of polytetrafluoroethylene resin, for example. Numeral 15 denotes a grounded copper conductor plate of the microstrip line 18, and $g_1$ and $g_2$ denote gaps each fabricated to have width of 0.5 mm.

By changing the intensity of the bias magnetic field Ho, the resonance frequency is changed in the range 5±0.4 GHz.

The negative resistance circuit shown in FIG. 3 was so fabricated as to conform to this impedance.

In order to perform the fine adjustment of the impedance, $l_2$ of the matching stub was removed successively from the right-hand side of FIG. 1A. Impedance matching between the negative resistance circuit side and the side of the magnetostatic wave device 1 wa thus taken.

Impedance matching was performed by changing the bias magnetic field Ho applied to the magnetostatic wave device in the range of 3300 to 3700 G, measuring the oscillation frequency, and trimming a length $l_2$, whereat resonance in the desired frequency band is caused, as the impedance matching point.

The frequency band obtained by adjusting this matching stub 8, in which oscillation can be caused, was $5\pm0.5$ GHz.

It was thus confirmed that impedance matching could be simply attained and oscillation at a desired frequency could be generated by adjusting the length $l_2$ of the matching stub 8. The material that the matching stub 8 comprises is a conductive material. As a matter of fact, it is desirable to use the same material as that of the microstrip line. In the present embodiment, it is desirable to use copper.

Embodiment 2

Figure 5:
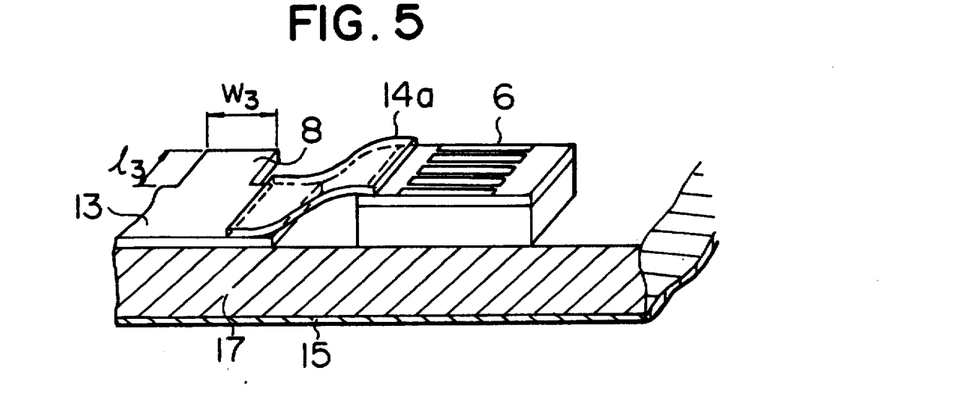
FIG. 5 is a diagram for illustrating a second embodiment of a magnetostatic wave device according to the present invention.

In FIG. 5, the stub 8 and the connection plate 14 of the embodiment 1 were removed. Instead, a matching stub 8 having length ($l_3$) of 2 mm and width ($w_3$) of 2 mm was formed in a conductor plate 13.

The resonance frequency of this magnetostatic wave device was $5\pm0.4$ GHz and was expected to be variable.

The negative resistance circuit shown in FIG. 3 was so designed and a high-frequency oscillation circuit was so fabricated as to conform to this impedance.

In order to perform fine adjustment of the impedance, $l_3$ of the matching stub 8 was successively removed. Impedance matching between the negative resistance circuit and the magnetostatic wave device 1 was thus performed.

Confirmation of the matching point, the applied magnetic field Ho, and the measuring method ar the same as those of the embodiment 1.

The resonance frequency obtained by adjusting this matching stub 8 was in the range of $5\pm0.5$ GHz.

As a result, it could be confirmed that the impedance adjustment was possible even if the matching stub 8 was fabricated before the magnetostatic wave resonator 6.

By adopting such configuration, the size of the magnetostatic wave device can be reduced than that of the embodiment 1.

As compared with the embodiment 1 in which the stub 8 is independent from the conductor plate 13 of the connection end, however, the resonance frequency band largely changes with respect to adjustment of the stub 8. As compared with the embodiment 1, therefore, effort is required for adjustment.

Embodiment 3

Figure 6:
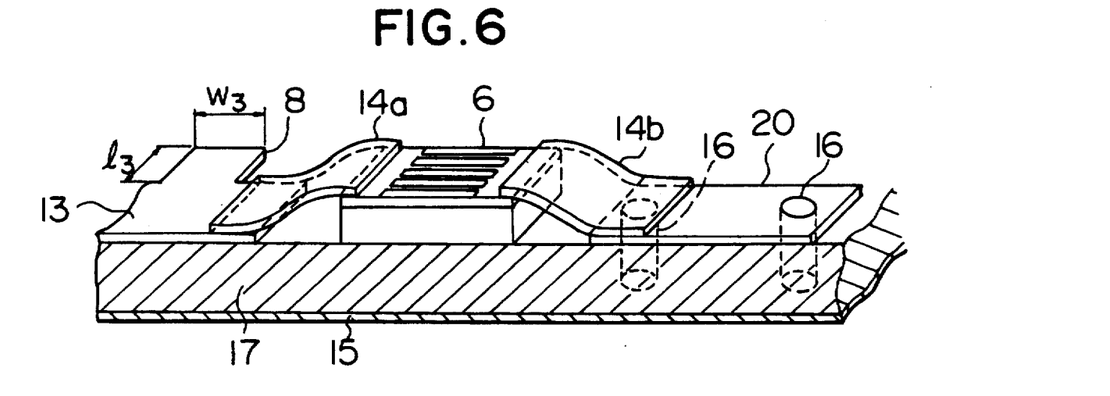
FIG. 6 is a diagram for illustrating a third embodiment of a magnetostatic wave device according to the present invention.

In FIG. 6, the matching stub 8 is provided in the conductor plate 13 in the same way as the embodiment 2, and in addition, a direct current path between the pad electrode 4b and the grounded conductor plate 15 of the microstrip line is formed via an upper conductor plate 20 by through-holes 16. The stub 8 and the magnetostatic wave resonator 6 are the same as those of the embodiment 2.

The resonance frequency of this magnetostatic wave device could be expected to be in the range $4\pm0.4$ GHz.

The negative resistance circuit shown in FIG. 3 was so designed and a high-frequency oscillation circuit was so fabricated as to confirm to this impedance.

In order to perform fine adjustment of the impedance, $l_3$ of the matching stub 8 was successively removed. Impedance matching between the negative resistance circuit and the magnetostatic wave device 1 was thus performed.

Confirmation of the matching point, the applied bias magnetic field Ho and the measuring method are the same as those of the embodiment 1.

The resonance frequency obtained by adjusting this matching stub 8 was in the range of $4\pm0.5$ GHz.

It is thus understood that impedance matching can be performed by using the matching stub 8 even in a structure causing resonance on the low-frequency side.

Embodiment 4

Figure 7:
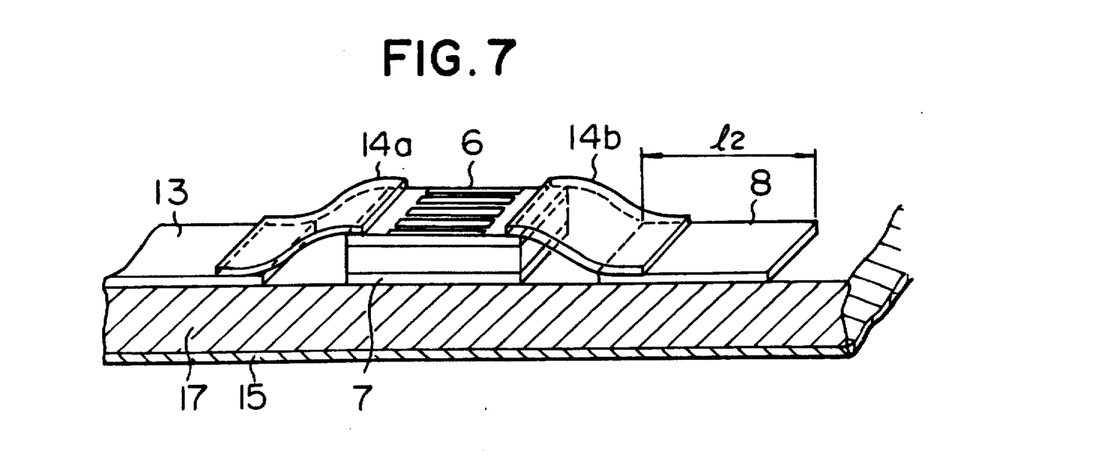
FIG. 7 is a diagram for illustrating a fourth embodiment of a magnetostatic wave device according to the present invention.

In FIG. 7, the conductor plate of the microstrip line located under the magnetostatic resonator 6 of the embodiment 1 is not removed but used as a lower conductor plate 7. It is desirable that dimensions of this lower conductor plate are installation face.

Other dimensions and materials are completely the same a those of the embodiment 1.

This magnetostatic wave device 1 could be expected to have a resonance frequency in the range of $4.5\pm0.4$ GHz. In the same way as the embodiment 1, the high-frequency oscillation circuit shown in FIG. 3 was designed and fabricated.

In order to perform fine adjustment of the impedance, $l_2$ of the matching stub 8 was successively removed. Impedance matching between the negative resistance circuit and the magnetostatic wave device 1 was thus performed.

Confirmation of the matching point, the applied bias magnetic field Ho and the measuring method are the same as those of the embodiment 1.

The resonance frequency obtained by adjusting this matching stub 8 was in the range of $4.5\pm0.5$ GHz.

It is understood that such a structure permits resonance at a lower frequency side as compared with the magnetostatic device 1 of the embodiment 1 without changing the structure of the magnetostatic resonator 1.

Embodiment 5

Figure 8:
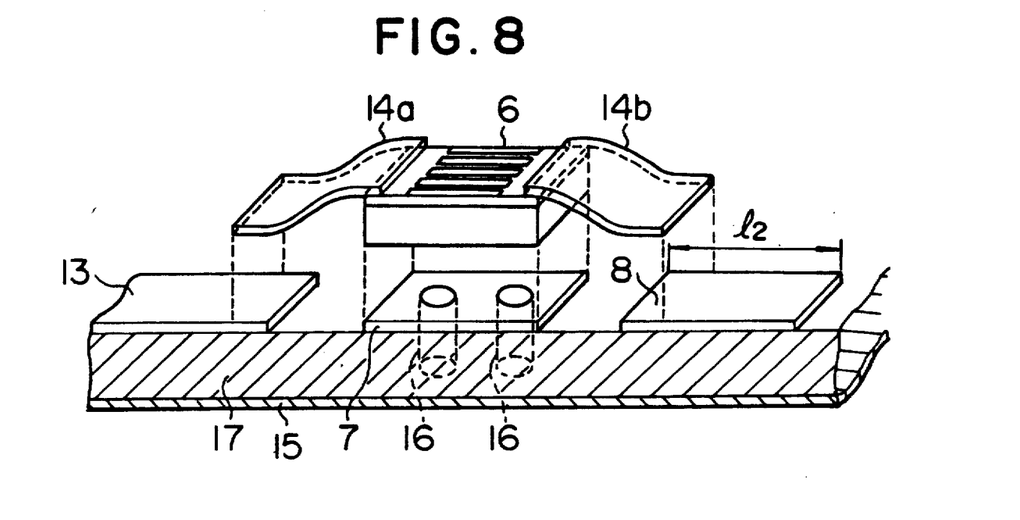
FIG. 8 is a diagram for illustrating a fifth embodiment of a magnetostatic wave device according to the present invention.

In FIG. 8, a direct current path is formed between the lower conductor plate 7 of the embodiment 4 and the grounded conductor plate 15 of the microstrip line via through-holes 16.

In this magnetostatic wave device, the grounded plane is the lower conductor plate 7 instead of the grounded conductor plate 15 in the embodiment 4. Since the electrostatic capacity between the magnetostatic wave resonator 6 and the grounded plane becomes large, therefore, resonance on the high-frequency side can be expected.

In this case, the resonance frequency of the magnetostatic wave device 1 could be expected to be in the range of $5.5\pm0.4$ GHz.

The negative resistance circuit shown in FIG. 3 was so designed as to conform to this impedance. The high-frequency oscillation circuit was fabricated.

In order to perform fine adjustment of the impedance, $l_2$ of the matching stub 8 was successively removed. Impedance matching between the negative resistance circuit and the magnetostatic wave device 1 was thus performed.

Confirmation of the matching point, the applied bias magnetic field Ho, and the measuring method are the same as tho  of the embodiment 1.

The resonance frequency obtained by adjusting this matching stub 8 was in the range of 5.5±0.5 GHz.

As a result, it could be confirmed that resonance could be caused on a higher frequency side as compared with the magnetostatic wave device 1 of the embodiment 1 without changing the structure of the magnetostatic wave resonator 1 of the embodiment 1.

Figure 9:
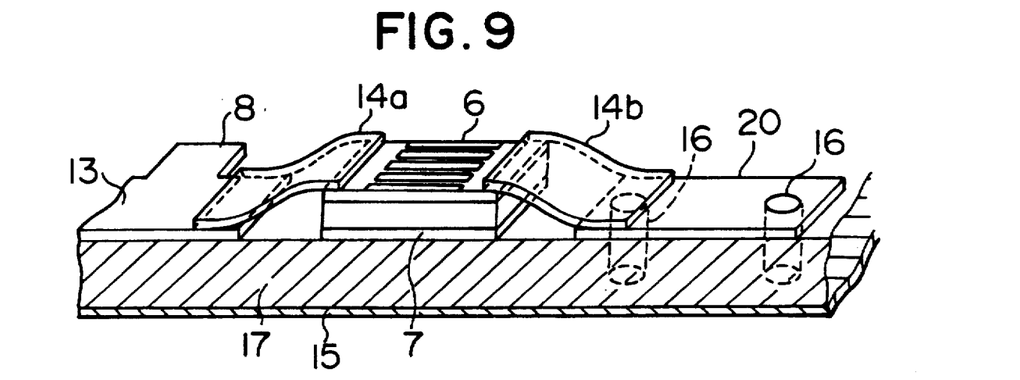
FIG. 9 is a diagram for illustrating another embodiment of a magnetostatic wave device according to the present invention.

In an embodiment shown in FIG. 9 as well in addition to the above described embodiments, impedance matching can be made by adjusting the matching stub 8. In the embodiment shown in FIG. 9, the matching stub 8 is provided in the conductor plate 13, and the lower conductor plate 7 is disposed. Further, the pad electrode 4b is coupled with the grounded conductor plate 15 of the microstrip line via the upper conductor plate 20 by through-holes.

Figure 10:
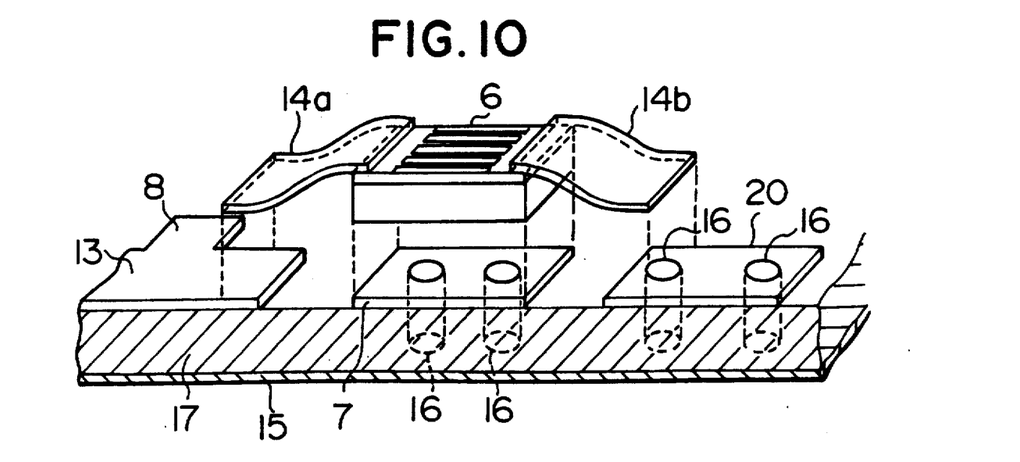
FIG. 10 is a diagram for illustrating another embodiment of a magnetostatic wave device according to the present invention.

In an embodiment 6 as shown in FIG. 10, the lower conductor plate 7 is coupled with the grounded conductor plate 15 of the microstrip line via through-holes. This embodiment 6 can also be used.

In the description of the above described embodiments, only the case where a microstrip line is used has been described. As the matching stub 8, however, a copper wire (coaxial line) directly grounded with respect to the pad electrode and adjusted in length may be used, for example.

Further, in case the matching stub 8 is separately provided as in the embodiment 1, the conductor plate 13 need not necessarily be a conductor plate, but the pad electrode 4a may be directly connected to the negative resistance circuit by using a coaxial line or the like.

Further, in the above described embodiment, a matching stub which is not directly grounded, i.e., the so-called open stub is used as the matching stub. Instead of this, however, a so-called short stub may be used. In this case, a through-hole for direct current connection with the grounded conductor plate 15 is formed in the matching stub of FIG. 1A, for example, and the impedance is adjusted by changing the position whereat the through-hole is formed to change the distance from the connection plate 14b to the grounded position.

The present invention is also applicable to the case where the magnetostatic wave resonator device and a part or the whole of the high-frequency oscillation circuit are integrated together.

Since the direction of the magnetic field depends upon the propagation mode as described before, the direction of the magnetic field illustrated in each drawing merely indicates an example for the purpose of explanation.

In the description above, the present invention is explained by examples of surface magnetostatic wave. As a matter of course, the present invention is also applicable to volume magnetostatic wave with appropriately selected direction of the bias magnetic field Ho.

We claim:

1. A magnetostatic wave device comprising:
    a dielectric substrate; and
    a magnetostatic wave resonator;
    said magnetostatic wave resonator comprising:
        a non-magnetic substrate mounted on said dielectric substrate;
        a magnetic thin film formed on said non-magnetic substrate;
        at least one electrode finger formed on said magnetic thin film;
        first and second pad electrodes formed at opposite ends of said at least one electrode finger on said magnetic thin film and used for external connection of said magnetostatic wave resonator;
    said magnetostatic wave resonator being responsive to a bias magnetic field to excite, propagate and resonate a magnetostatic wave; and
    a matching stub formed of a conductive member and having first and second terminals, said first terminal of said matching stub connected to said first pad electrode to adjust impedance matching of said magnetostatic device and said second terminal of said matching stub set to be open.

2. A magnetostatic wave device according to claim 1, wherein said magnetostatic wave resonator and said matching stub are disposed on said dielectric substrate.

3. A magnetostatic wave device according to claim 1, further comprising:
    a microstrip line comprising a first conductor plate formed in two pieces on one face of said dielectric substrate, and a second conductor plate formed on the other face of said dielectric substrate;
    said magnetostatic wave resonator being disposed on a region of said dielectric substrate, a part of said first conductor plate being spaced apart from said region; and
    said first and second pad electrodes being respectively connected to said two pieces of said first conductor plate respectively via connection plates;
    wherein one of said two pieces of said first conductor plate has an open end terminal and is used as said matching stub.

4. A magnetostatic wave device according to claim 3, wherein one of said two pieces of said first conductor plate is connected to said second conductor plate via through-holes formed through said dielectric substrate.

5. A magnetostatic wave device according to claim 3, wherein the other of said two pieces of said first conductor plate is coupled to a negative resistance circuit.

6. A magnetostatic wave device according to claim 3, further including a third conductor plate disposed between said magnetostatic wave resonator and said dielectric substrate.

7. A magnetostatic wave device according to claim 3, further including a third conductor plate disposed between said magnetostatic wave resonator and said dielectric substrate, said third conductor plate being connected to said second conductor plate via through-holes formed through said dielectric substrate.

8. A magnetostatic wave device according to claim 1, comprising:
    a microstrip line comprising a first conductor plate formed in two pieces on one face of said dielectric substrate, and a second conductor plate formed on the other face of said dielectric substrate;
    said magnetostatic wave resonator being disposed on a region of said dielectric substrate, a part of said first conductor plate being spaced apart from said region; and
    said first and second pad electrodes being respectively connected to said two pieces of said first conductor plate respectively via connection plates;
    wherein one of said two pieces of said first conductor plate is used as said matching stub and is connected to said second conductor plate.

9. A magnetostatic wave device according to claim 8, wherein the other of said two pieces of said first conductor plate is coupled to a negative resistance circuit.

10. A magnetostatic wave device according to claim 8, further including a third conductor plate disposed between said magnetostatic wave resonator and said dielectric substrate.

11. A magnetostatic wave device according to claim 8, further including a third conductor plate disposed between said magnetostatic wave resonator and said dielectric substrate, and said third conductor plate being connected to said second conductor plate via throughholes formed through said dielectric substrate.

12. A magnetostatic wave device according to claim 1, comprising:
- a microstrip line comprising a first conductor plate formed as one piece on one face of said dielectric substrate; and
- a second conductor plate formed on the other face of said dielectric substrate;
- wherein said magnetostatic wave resonator is disposed on said one face of said dielectric substrate, said first pad electrode of said magnetostatic wave resonator connected to said microstrip line and said second pad electrode set to be open, and said matching stub connected to said first pad electrode through said microstrip line.

13. A magnetostatic wave device comprising:
- a dielectric substrate; and
- a magnetostatic wave resonator;
- said magnetostatic wave resonator including:
  - a non-magnetic substrate mounted on said dielectric substrate;
  - a magnetic thin film formed on said non-magnetic substrate;
  - at least one electrode finger formed on said magnetic thin film;
  - first and second pad electrodes formed at opposite ends of said at least one electrode finger on said magnetic thin film and used for external connection of said magnetostatic wave resonator;
  - said magnetostatic wave resonator being responsive to a bias magnetic field to excite, propagate and resonate a magnetostatic wave; and
  - a matching stub connected to said first pad electrode and a portion of said matching stub trimmable when said matching stub is connected to said first pad electrode for adjusting impedance matching between said magnetostatic wave device and an external circuit connected to said magnetostatic wave device.

* * * * *